United States Patent [19]

Fegley et al.

[11] Patent Number: 4,485,290

[45] Date of Patent: Nov. 27, 1984

[54] BONDING A WORKPIECE TO A BODY

[75] Inventors: Charles R. Fegley, Laureldale; Lorenz Regneth, Wyomissing; Joseph A. Tamashasky, New Philadelphia, all of Pa.

[73] Assignee: AT&T Technologies, Inc., New York, N.Y.

[21] Appl. No.: 438,229

[22] Filed: Nov. 1, 1982

[51] Int. Cl.³ .............................................. B23K 1/12
[52] U.S. Cl. ........................ 219/85 CA; 219/85 CM; 219/85 D
[58] Field of Search .......... 219/85 CA, 85 CM, 85 D, 219/85 M

[56] References Cited

U.S. PATENT DOCUMENTS

| | | |
|---|---|---|
| 2,757,324 | 7/1956 | Pearson .......................... 219/85 CA |
| 4,220,966 | 9/1980 | Montone . |
| 4,233,520 | 11/1980 | Canfield . |
| 4,255,644 | 3/1981 | Delorme .......................... 219/85 D |
| 4,289,374 | 9/1981 | Franken et al. . |
| 4,296,998 | 10/1981 | Dufft . |
| 4,343,643 | 8/1982 | Miller . |

*Primary Examiner*—Clifford C. Shaw
*Attorney, Agent, or Firm*—D. C. Watson

[57] ABSTRACT

A workpiece such as a miniature stud (10) supports a chip (20) having a heat and light sensitive device therein. Such stud (10) is thermally bonded to an insulative body (12) to form a guide (14) for converting light to electrical pulses. A positive and a negative electrode (44 and 45), respectively, are each connected to a respective pole of a power supply for providing electrical current adequate for the bonding. A resistance heating element (42) conducts the current from electrode (44) at least partially along a path through the stud (10) to electrode (45). For stud (10), the path is selected preferably by providing a thru hole (90) in element (42) under the position occupied by the heat sensitive device when stud (10) is placed upon the element (42). The current concentrates in stud (10) along an annular ring (29) where heating is required sufficiently to thermally bond at least the ring (29) of the stud (10) to the body (12).

8 Claims, 5 Drawing Figures

BONDING A WORKPIECE TO A BODY

TECHNICAL FIELD

This invention relates to thermally bonding a workpiece to a body. More particularly, the invention relates to such bonding wherein heat is developed at selected portions of a workpiece and is substantially avoided at portions undesirably sensitive to heat.

BACKGROUND OF THE INVENTION

In assembling miniature components, for example in electronics work, the art of bonding such small components is a challenging task. Bonding methods and means have been developed for conventional semiconductor work, such as in bonding leads to pads on a chip. However, there seems to be a paucity of art available concerning the assembly of lightwave devices; yet such assembly is emerging as a relevant and material part of semiconductor work.

For example, in processing light from a glass fiber, a semiconductor device such as an avalanche photodiode (APD) formed in silicon is often utilized to convert such light to electrical pulses. To couple output light from a fiber to an input junction of an APD, a guide is conveniently employed having a body typically about ⅛-inch in diameter and length. A disc-like stud having an APD mounted centrally thereon is bonded at one end of the guide with the APD facing a bore in the body. When the APD is properly positioned and the guide is slipped over the end of a fiber, light emitted into the bore impinges upon and operates the APD. A problem is that the stud is so small it is difficult to bond to the body with the APD in precise registration with the bore. Another problem is that the APD and its chip mounting to the stud are undesirably sensitive to high temperatures sometimes experienced in thermal bonding.

To register the APD, the chip is mounted to a pedestal which is located centrally of the stud. Accordingly, only an annular ring surface of the stud makes contact, ideally with a corresponding metallized ring seat on the body of the guide. A ring member of preformed solder resembling a washer is installed therebetween which melts on heating and solidifies on cooling to bond a ring portion of the stud to the seat. A problem is to retain the stud and the washer in registration with the seat to make a sufficiently strong joint that the assembly may be readily removed and a new work cycle initiated.

In a conventional method of heating small workpieces, a heater having the shape of a rifle cartridge is often utilized. The heater has a thin axial member made of a refractory material around which there is wound a fine heating wire. Then an insulative sleeve encloses the axial member and wire to avoid grounding and a metal enclosure with electrical connections completes the unit. Such a heater is normally inserted vertically into and flush with a work surface whereon assemblies are made and a workpiece is positioned on top of the cartridge heater as one would dispose a pot on an electric stove. A problem with this method is that it takes an unacceptably long time to heat the cartridge and the workpiece thereon sufficiently to liquify a solder washer. Another problem is that the large mass of the heater retains heat unacceptably long after electrical current ceases. Consequently, time is required to cool the workpiece sufficiently so an assembly may be readily removed without breaking or otherwise disturbing a bonded joint.

Accordingly, it is desirable to develop new and improved expedients for thermally bonding a workpiece especially a minute workpiece, to a small body. It is further desirable to bond workpieces which have discrete bonding surfaces distinct from other portions of a workpiece. In particular, the heat utilized should be rapidly developed and rapidly dissipated to expedite work cycles in assembling components. Moreover, it is desirable to develop heat in a workpiece primarily at portions requiring heat for bonding and substantially avoiding heat at other portions which may be undesirably heat sensitive.

SUMMARY OF THE INVENTION

Expedients are provided for thermally bonding a workpiece to a body. A positive and a negative electrode are each adapted for connection to a respective pole of a power supply for providing electrical current adequate for the bonding. According to conventional designation, such current is conducted from the positive electrode, at least partially along a path through the workpiece to the negative electrode. The path is selected, such as by supporting the workpiece on a resistive element connecting the electrodes, to advantageously concentrate current within the workpiece. Such current concentrates where heating is required sufficiently to thermally bond at least a desired portion of the workpiece to the body.

In an exemplary embodiment, the workpiece is a stud having a disc-like base and a centrally located pedestal with a heat sensitive device mounted thereon. The resistive element is a flat, nickel-chrome strip about as wide as and supporting the base of the workpiece. The strip is sufficiently thin and has a thru hole located centrally of the strip such that current and heat are diverted into the base and away from the pedestal. Consequently, a peripheral ring portion of the base receives concentrated current and heat to rapidly melt a washer of solder to bond the ring portion to a metallized ring seat on the body. The electrodes are of sufficient mass and shape of copper that resistance to the bonding current flowing therethrough is insufficient to heat them above room temperature. Therefore, when current stops, each electrode functions as a sink to draw heat from the workpiece and facilitate rapid cycling of successive bonded assemblies.

BRIEF DESCRIPTION OF THE DRAWING

The invention will be more readily understood from the following detailed description when read in conjunction with the accompanying drawing wherein.

Figure 1:
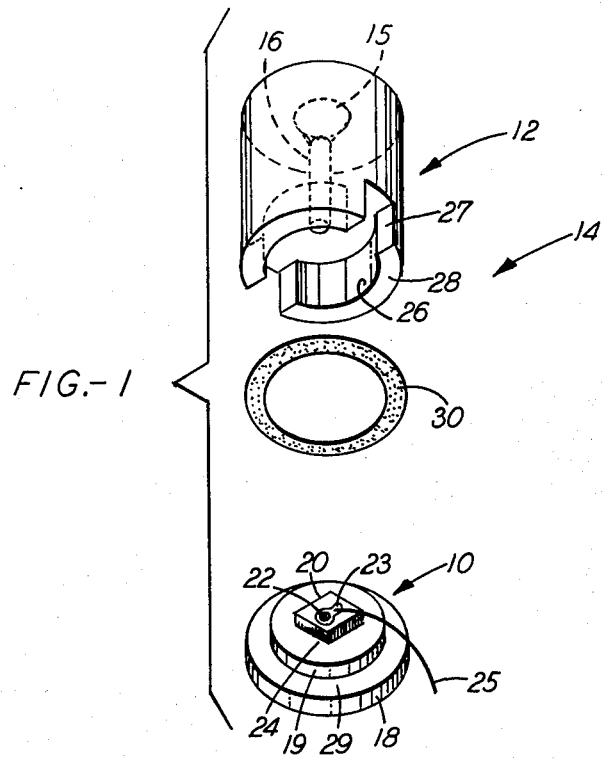
FIG. 1 is an exploded view of a workpiece and body which may be assembled according to the present invention.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

A Workpiece and a Body

FIG. 1 is an exploded view of components including a workpiece 10 and a body 12 which may be bondably assembled in the practice of the present invention. When the components are properly aligned and bonded together the assembly is referred to as a guide 14 which may be utilized as later described in the processing of lightwaves.

For electrical insulation purposes, the body 12 is typically formed of unglazed alumina and it appears as a white porcelain object having a vitreous surface when it is completed. Body 12 has the shape of a right cylinder about 0.115 inch in diameter and about 0.120 inch high. At the top end of body 12 a countersunk funnel 15 is provided to facilitate inserting a glass fiber into an inner bore 16 during installation of the guide 14. At the bottom end of body 12, several features are provided which are readily explained with respect to workpiece 10.

Workpiece 10 is also referred to as a stud 10 and is typically formed of a metal such as molybdenum or an alloy of iron-nickel-cobalt. Stud 10 includes a disc-like base 18 which is about 0.125 inch in diameter and about 0.015 inch thick supporting a circular pedestal 19 about 0.060 inch in diameter and about 0.017 inch thick.

Stud 10 serves as a conductive substrate for a chip 20 which contains a light sensitive device such as an avalanche photodiode (APD). The APD has a junction target 22 which is sensitive to light and is about 0.010 inch in diameter. The target 22 is underlaid and surrounded by a terminal portion 23 having a tear drop outline to which is bonded a lead 25.

Chip 20 is mounted to pedestal 19 typically utilizing a eutectic bonding material 24 such as an alloy of germanium and gold which is expensive but is considered important to accommodate differential expansion between chip 20 and pedestal 19 under conditions of high temperature and stress. In addition, the APD is itself sensitive to high temperatures which are sometimes inadvertently experienced in assembly operations. Accordingly, it is desirable that the workpiece 10 be assembled to the body 12 by avoiding, as much as feasible, high temperatures in the pedestal 19.

The body 12 includes a large counterbore 26 to accommodate pedestal 19, and a channel 27 for access to chip 20 and to accommodate lead 25. Body 12 has a metallized seat 28 for bonding to a ring portion 29 on base 18 of stud 10. A bonding medium to seal a joint between seat 28 and base ring 29 is provided in the form of a washer 30 of a preformed bonding material. The presently preferred bonding material contains about 60% tin and 40% lead which softens at about 361° F. and is liquefied at about 370° F. However, it is expected that a bonding material which contains tin and silver and which melts at a higher temperature will soon be required for reasons which will now be explained.

In operation of guide 14, a glass fiber (not shown) is inserted into bore 16 and the light therefrom impinges upon junction target 22 of the APD. A heavy bias is applied over the APD utilizing a lead later attached to stud 10 and lead 25. A pulse of light applied to target 22 generates electrons which are greatly amplified and fed to a circuit for regenerating and repeating a signal in known ways. A problem is that the target 22 should be aligned to the bore 16 to within about 0.001 inch of true concentricity of one to the other. Another problem is that guide 14 is installed in a receiver (not shown) by soldering the top end of body 12 shown in FIG. 1. When such soldering is performed, the ambient heat is sometimes sufficient to soften the 60/40 solder provided by washer 30 and the alignment of stud 10 to body 12 may then be destroyed. Consequently, it is desirable to provide new and improved expedients to bondably assemble stud 10 to body 12. It is desirable to utilize high temperature techniques without affecting the temperature sensitive APD or its chip mounting.

Aligning the Components

Figure 2:
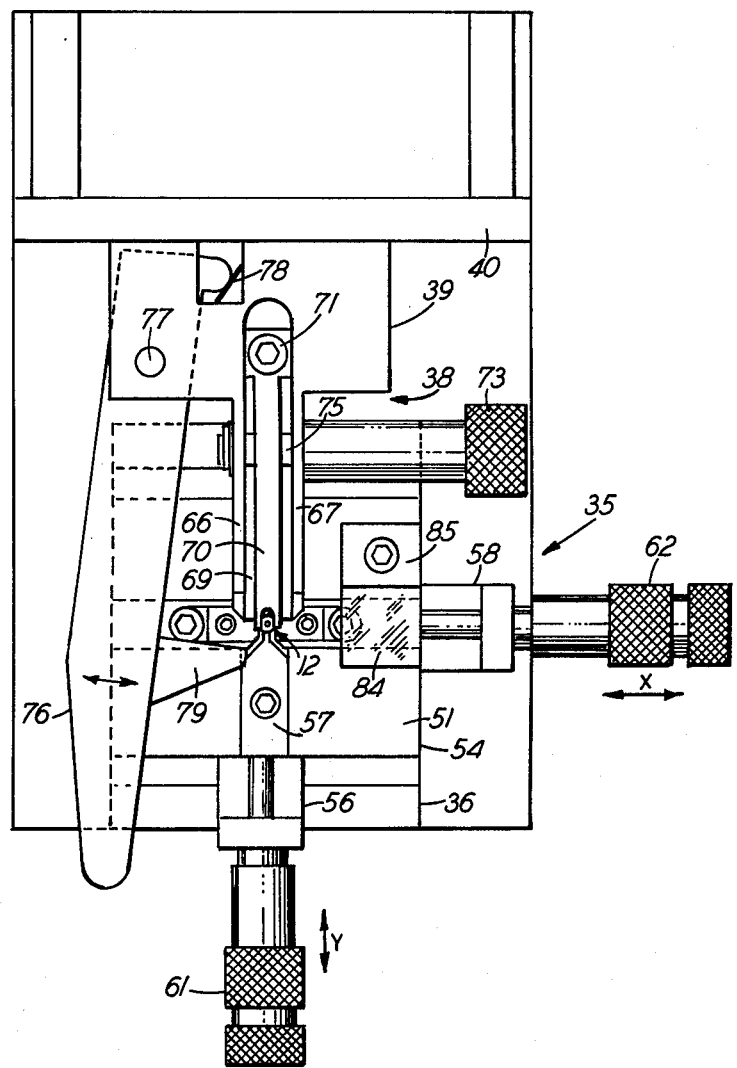
FIG. 2 is a plan view of apparatus for assembling a workpiece to a body in accordance with the present invention.

FIG. 2 is a plan view of apparatus for aligning the components and for bonding the workpiece 10 to the body 12 in accordance with the invention. The apparatus includes a movable portion 35 which is supported from a base plate 36 and utilized for securing and manipulating the workpiece 10 (hidden by body 12 in FIG. 2). A fixed portion 38 is also provided which is supported by a block 39 affixed to an upright stand 40 and utilized for securing the body 12 as shown.

An overhead portion (not shown) is also provided to illuminate the work and permit accurate viewing and alignment of the workpiece 10 to the body 12. The overhead apparatus is an advancement over the prior art in which conventional illumination and a conventional microscope had sometimes been utilized for similar functions. Accordingly, the alignment of components such as the stud 10 to the body 12 is more fully described and claimed in an application entitled "Aligning a Workpiece to a Body" filed the same day as and assigned to the same assignee as the present application. The overhead apparatus and its application for aligning components will be verbally described herein for disclosing a presently preferred mode of practicing the instant invention. To the extent further information may be required herein, the application referred to is hereby incorporated herein and made a part hereof by this reference.

Figure 3:
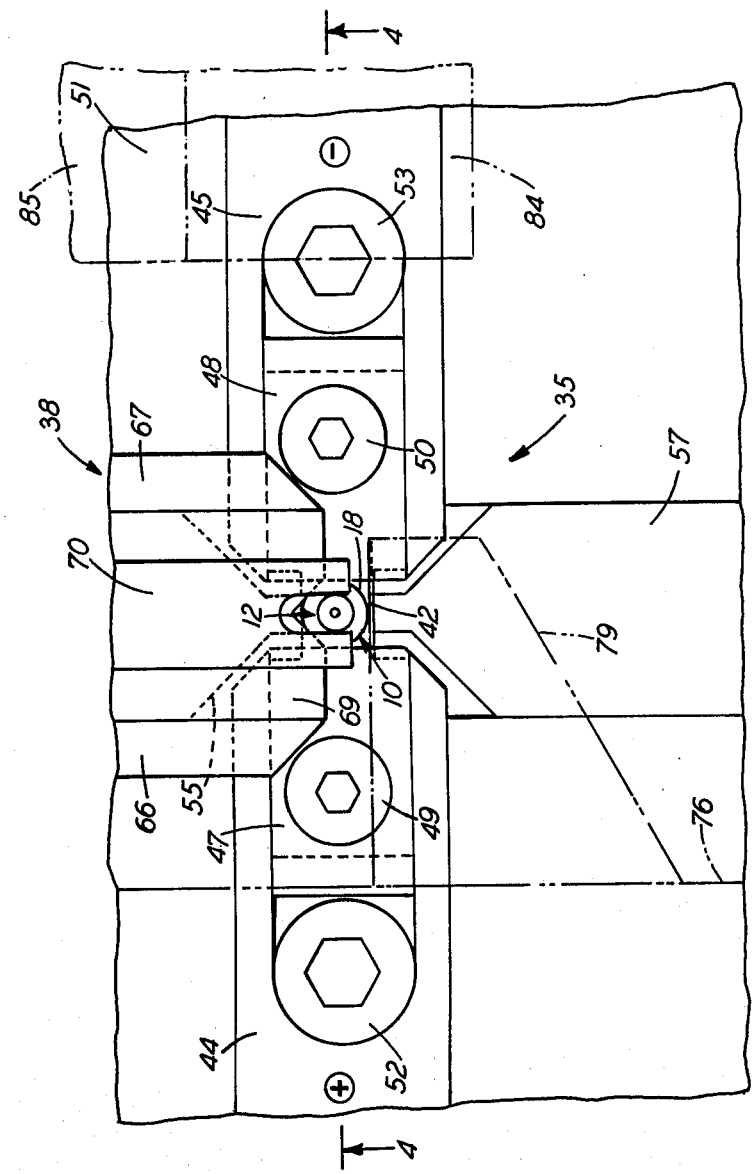
FIG. 3 is an enlarged plan view of a portion of the apparatus shown in FIG. 2.
Figure 4:
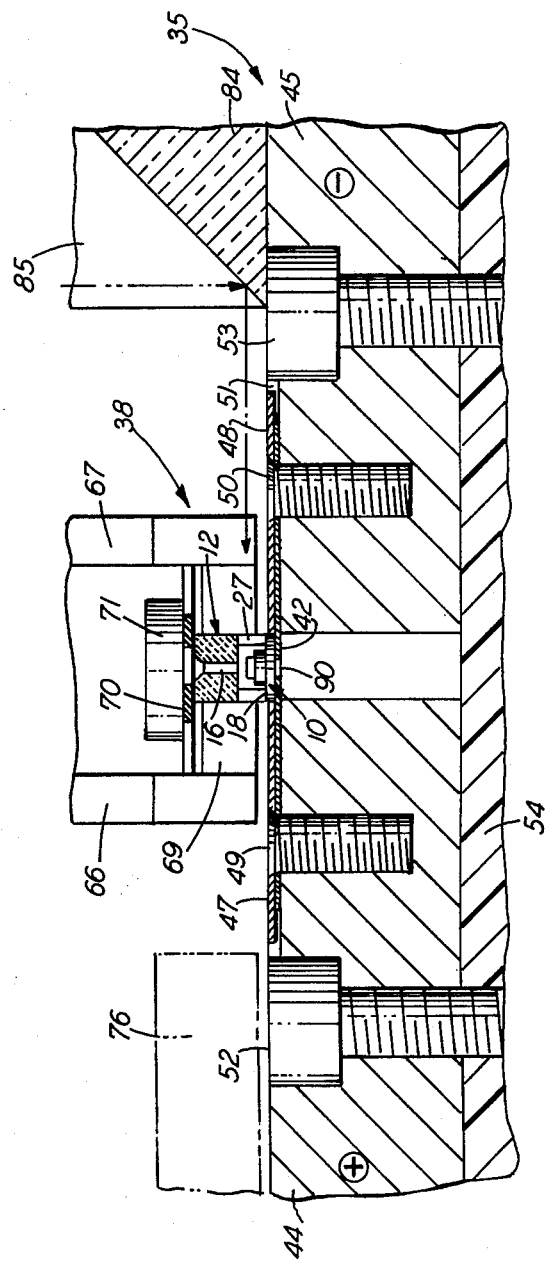
FIG. 4 is a sectional view of the apparatus shown in FIG. 3 taken along line 4-4.

Reference is further made to FIGS. 3 and 4 which are enlarged plan and sectional views, respectively, of the workholding features of portions 35 and 38 of the apparatus. Both figures also include the bonding features associated with movable portion 35 of the apparatus.

An operator selects a stud 10 and places it in a nest which is best seen in FIG. 4. The stud 10 is supported by a resistance heating element 42 connected between electrodes 44 and 45. Element 42 is held in place by plates 47 and 48 which are set flush with work surface 51 and have opposing ends which aid in confining stud 10. Plates 47 and 48 are affixed to electrodes 44 and 45, respectively, by countersunk screws 49 and 50 which also restrain element 42. However, sufficient clearance openings (not shown) are provided in element 42 and around screws 49 and 50 to permit thermal expansion when such element heats during a bonding cycle.

It is further seen that electrodes 44 and 45 are affixed by sunken cap screws 52 and 53, respectively, to a support block 54. Support block 54 is extensively utilized as a work table by machining recesses into its top surface 51 for described accessories as will be seen in FIGS. 3 and 4. For example, recesses are provided to receive members 55 and 57 and each member tapers to an abutment edge to complete the nest for confining the base 18 of stud 10 in movable portion 35 of the apparatus.

As indicated in FIG. 2, portion 35 of the apparatus is provided for manipulating the workpiece 10 in an X-direction (left-to-right) or a Y-direction (front-to-back). The work surface 51 is provided by block 54 which is supported by a micropositioning fixture 56 for movement in the Y-direction. Fixture 56 is, in turn, affixed to and supported by a similar micropositioning fixture 58 for movement of block 54 and fixture 56 in the X-direction and fixture 58 is affixed to the base 36. Fixtures 56 and 58 may be those designated as "Micropositioners Model-B" and sold by Line Tool Company, Allentown, Pa. Fixtures 56 and 58 are manipulated by operation of micrometer screw heads 61 and 62, respectively. Consequently, stud 10 may be moved in very fine increments in either the X or the Y-direction.

After placing a stud 10 in the nest in movable portion 35, an operator places a body 12 upon the stud and such body is restrained in portion 38 of the apparatus. Portion 38 (FIG. 2) includes block 39 which is supported by stand 40 which also may support the viewing and illuminating apparatus (not shown). Block 39 has a front extending portion which includes sidewalls 66 and 67 and a flat member 69 having a "V" notch to confine the body 12.

Between sidewalls 66 and 67, a flat leaf spring 70 is installed on top of and affixed to flat member 69 by a screw 71 and biased downwardly upon the body 12. Spring 70 is raised or lowered by operating a knob 73 which turns a shaft having a flat portion 75 thereon located under the leaf spring.

A body 36 may be further restrained in the "V" notch in member 69 by an arcuately movable clamp 76 shown in an inactive condition for clarity in FIG. 2. Clamp 76 is pivotally mounted in block 64 by a pin 77 and is arcuately biased by a leaf spring 78 toward the "V" notch where a finger portion 79 contacts body 12 as best seen in phantom lines in FIG. 3.

In aligning the workpiece 10 to the body 12 an overhead light (not shown) directs visible light downwardly into a prism 84 mounted to surface 51 by a bracket 85. Prism 84 (FIG. 4) further directs the light to the lower portion of body 12 and, more particularly, the light is directed through the channel 27 of body 12 to the lower end of bore 16. At least some portion of the light is redirected at body 12 sufficiently to pass longitudinally and upwardly along the surfaces of the bore 16. An image of the bore 16 is thereby projected upwardly from the top end of body 12.

The image of bore 16 is preferably enlarged about thirty times by an overhead lens system (not shown). A suitable lens system comprising four sets of extension tubes, a doubler lens and a 75 mm lens is sold by Video Marketing, Inc. of Warrington, Pa. The lens system magnifies the image of the bore 16 to about ⅜ inch diameter and it is then conveniently sensed by a commercially available video camera (not shown) such as an Hitachi TV Camera HV 620. The camera, in turn, projects the image on a monitor (not shown) such as an Hitachi Monitor VM-906A. It has been found that the image of the bore advantageously appears as a halo on a video monitor.

The operator then manipulates X or Y micrometer screw heads 62 or 61, respectively, to move the workpiece 10. The workpiece 10 reflects sufficient light to cast an image of at least a portion of target 22 through bore 16 and its halo into the video sensing equipment. Conveniently the target 22 appears as a black object within the image of the bore 16. Such manipulation of the screw heads 62 and 61 on portion 35 of the apparatus is continued by the operator to move the stud 10 relative to the body 12. When the black image of target 22 is sufficiently within the halo of bore 16, desired alignment of stud 10 with respect to bore 16 is achieved and bonding can begin.

Bonding the Components

After the workpiece 10 has been properly aligned to the body 12, a ring joint between the components is made by thermal bonding. By thermal bonding is meant that heat is utilized to make the joint rather than a cold process such as by a glue or a cementing agent. By reference to FIG. 1, it can be seen that making a joint between the illustrative components may be initiated by heating the ring portion 29 of stud 10. Such heating should be sufficient that bonding material in washer 30 melts adequately to thoroughly wet a metallized seat 28 on body 12 and the ring portion 29 of stud 10. Then the bonding material should be cooled before liquid bonding material is exuded from the joint and overflowed onto the base 18 of stud 10. The bonding material should also gain sufficient strength by cooling stud 10 that the assembled guide 14 may be removed from the alignment apparatus without destroying the registration of target 22 with the bore 16. Further, the heating of stud 10 should be so controlled that there is substantially no significant increase in temperature in chip 20 and its mounting to pedestal 19. Not the least important in today's market, the bonding step in a work cycle for assembling the components should consume as little time as possible. Many of these desired advances are achieved in the practice of the instant invention, which will now be further described.

Referring to FIGS. 3 and 4, electrodes 44 and 45 are each connected to a respective pole of a power supply (not shown) for providing electrical power adequate for the bonding. Such power is advantageously provided by a silicon controlled rectifier (SCR) which fires in long or short pulses in response to a controller. For example, if a steep ramp of temperature increase is required such as for rapidly heating a massive workpiece, the pulses would be about as long as a particular SCR can provide. On the other hand, if a gentle ramp of temperature increase is required such as for heating a minute workpiece, the pulses would be minimally short.

In the instant case, it is desirable to ramp the temperature of the element 42 to raise the temperature of stud 10 from room temperature to about 375° F. Such rise should be accomplished rapidly but without subjecting the stud 10 to excess thermal expansion, stress and shock. A steep ramp is readily achieved because stud 10 is of little mass. However, for good bonding, it is desirable to have a soaking time period at 375° F. represented by a plateau at the top of a temperature ramp. Moreover, such plateau should be achieved without overheating for stress reasons and for achieving a rapid down ramp of temperature when a bond has been made.

To achieve these goals, certain apparatus may be utilized according to published manufacturer's literature so further instruction is not required in this application. For example, an SCR unit type 931/932 may conveniently be utilized which is controlled by a Digital Temperature Controller Model 919/909. Between a thermocouple sensing the temperature of element 42 and the controller, a Programmer Type 125 (PT125)

may be utilized to modify signals for up ramping the temperature of element 42. Also, in a similar manner, an Auxiliary (programming) Unit Type 126 (PT126) is desirably utilized to modify signals for down ramping of the temperature. The controller and programmers are sold under the model and type designations set forth above together with detailed instruction on their use by Eurotherm Corporation of Reston, Va.

In operation of the power system for feeding element 42, an operator initiates a start cycle in the controller. The temperature ramps up in response to low temperature signals from a thermocouple affixed to element 42. Such signals are modified by PT125 to provide a desired up ramp in temperature of the stud 10 to about 375° F. without significantly overshooting such temperature. When the desired plateau is achieved a timer is initiated. At the end of a desired period, the timer actuates PT126 which signals the controller to cut off power from the SCR and PT126 monitors the thermocouple signal until element 42 cools to about room temperature. A signal light in the controller then instructs the operator to remove the workpiece and the programmers are automatically reset.

Utilizing the above described power system, it is found that about 60 amps D.C. at about 1 to 1.2 volts is suitable to heat the stud 10 for bonding. Also, the bonding cycle consumes about 3-4 seconds in the work cycle.

Referring to FIG. 4, the stud 10 can be seen resting on heating element 42. Element 42 is advantageously made of a nickel-chrome alloy which will withstand heat and corrosion and is about 10 times as resistive to electrical current flow as common steel. Accordingly, element 42 wears well in service and preferentially diverts current into more conductive materials of a workpiece 10 which may contain metals such as iron, nickel, cobalt or molybdenum.

The function of element 42 is to conduct current (according to conventional designation) from positive electrode 44, at least partially along a path through the stud 10 to the negative electrode 45. Of course much of the bonding current passes directly through element 42 where it develops heat according to the mass and shape of material and, therefore, the conductive properties of the element. It has been found desirable to heat a workpiece such as the illustrative stud 10 with a strip of nickel-chrome alloy which is about ⅛ inch wide and about 0.008 inch thick. It will be appreciated that element 42 has so little mass that it quickly heats and quickly cools.

The electrodes 44 and 45 are also selected and conveniently disposed to speed up the heating and cooling of element 42 and a workpiece such as a stud 10 mounted thereon. For example, each electrode measures about ⅜ inch in width by about 5/16 inch in depth and they are made of copper which is highly conductive of electricity and heat. Accordingly, such electrodes are of sufficient mass and shape of suitable material that resistance to bonding current flowing therethrough is insufficient to heat an electrode above room temperature. Therefore, when current ceases to flow, each electrode functions as a sink to draw from the workpiece 10 considerable heat. In fact, sufficient heat is withdrawn that a stud 10 may be readily removed without breaking the bond to the body and without providing cooling time before initiating a new work cycle.

In a further effort to speed up the heating and cooling cycle, it can be seen in FIG. 4 that the electrodes 44 and 45 are set close together. Such closeness of abutting edges assists in confining a stud 10 to the nest area; it also enhances conductance of current and heat between each electrode and the workpiece 10.

Figure 5:
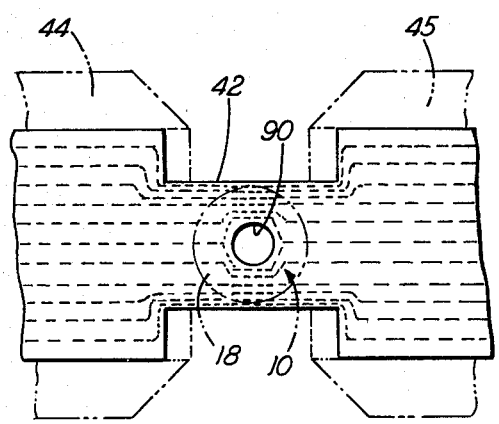
FIG. 5 is a plan view of a resistive member showing diversion of current into a workpiece in accordance with the present invention.

Reference is now made to FIG. 5 which is a greatly enlarged plan view of heating element 42, the electrodes 44 and 45 and the stud 10 which is shown in phantom. FIG. 5 also includes dotted lines which are utilized to theoretically depict current flow and consequent intensities caused by the shape of the element 42. In the portion of element 42 which contacts electrodes 44 and 45, it can be seen that the lines are broadly and uniformly spaced. In the portion of 42 which is free of the electrodes but away from a hole 90, the lines are more narrowly and less uniformly spaced. In the portion of 42 which includes hole 90, about ½ the lines are concentrated on each side of the opening in the continuous portions of the element.

It will be appreciated that the element 42 is shaped to make effective contact to the base 18 of stud 10 wherein heat is required for bonding. Moreover, the thickness and material for element 42 is selected to divert a desired amount of current through the workpiece 10 for concentrating and developing heat at portions desired for bonding. For example, by utilizing an element 42 made of 80% nickel and 20% chrome and of the size and shape previously described, about 20% of the bonding current is diverted into workpiece 10.

It will also be noted in FIGS. 4 and 5 that the thru hole 90 has been provided centrally of element 42. Hole 90 is located at about the region where pedestal 19 is found when the base 18 of a stud 10 is confined in the nest and on top of element 42. Hole 90 is provided to frustrate passage of heat from element 42 directly into pedestal 19 and the chip 20 mounted thereon. Hole 90 also operates to divert considerable current into the stud 10. For example, it has been found by experiment that a 3/64 inch diameter hole 90 causes about 25% more current to be diverted into stud 10 than is diverted therein when a solid strip is utilized as a heating element.

Of course, it will be appreciated that substantially all available current passing from electrode 44 to electrode 45 could be diverted into a workpiece 10. For example, clamps could be provided from each electrode to a stud 10. However, it is considerably more practical to avoid the labor and time associated with clamping and unclamping a workpiece in each cycle. Also, it will be appreciated that application of heat and current to a ring portion of stud 10 is more readily achieved with the conducting expedient afforded by element 42.

There have been illustrated herein certain practical embodiments of the invention and certain applications thereof. Nevertheless, it is to be understood that various modifications and refinements may be made and used which differ from these disclosed embodiments without departing from the spirit and scope of the present invention.

What is claimed is:

1. Apparatus for thermally bonding a conductive workpiece to a body, comprising:
   first and second electrodes, each adapted for connection to a respective pole of a power supply for providing electrical current adequate for the bonding; and
   means for conducting the current between the first electrode and the second electrode, including an element of a width and shape adapted for contacting the workpiece along portions thereof requiring heat for the bonding, said element being smaller in mass and made of a less conductive material than the workpiece to divert a desired amount of the current along a first path through and for concentrating current within the workpiece for developing substantial heat therewithin and said element also conducting current along a second path in the element to develop heat in the element and transfer the same to the workpiece, the heat from both paths being sufficient to thermally bond at least a desired portion of the workpiece to the body.

2. Apparatus as in claim 1, wherein the first and second electrodes are of sufficient mass and shape of suitable material that resistance to the bonding current flowing therethrough is insufficient to heat an electrode above room temperature such that, when current stops, each electrode functions as a heat sink to draw from the workpiece sufficient heat that the workpiece may be readily removed without breaking the bond to the body and wherein the means for conducting further comprises:

means for locating the first and second electrodes sufficiently close together to substantially confine the workpiece therebetween in a position suitable for bonding to the body and to enhance conductance of current and heat between each electrode and the workpiece.

3. Apparatus as in claim 2, wherein the workpiece is a stud having a base in the shape of a disc and a centrally located pedestal on the disc for mounting a heat sensitive device to the pedestal and wherein the resistive heating element further comprises:

a flat strip about as wide as and supporting the base of the workpiece and connecting the electrodes sufficiently close together that the base is confined for positioning the workpiece for bonding to the body, said strip being sufficiently thin and of a material suitable to divert current and heat into the base, said strip also having a thru hole therein under the centrally located pedestal portion of the base for diverting current and heat away from the pedestal and into a peripheral ring on the base whereon a heat sensitive bonding medium is located for bonding said ring portion of the workpiece to the body.

4. Apparatus as in claim 3, wherein the connections to the power supply are flexible, further comprising:

means for manipulating the electrodes and the conducting means with the workpiece confined therewith for aligning the workpiece to the body prior to bonding the same.

5. A method of thermally bonding a conductive workpiece to a body, comprising:

providing electrical current adequate for the bonding via first and second electrodes, each connected to a respective pole of a power supply; and conducting the current between the first electrode and the second electrode utilizing an element of a width and shape adapted for contacting the workpiece along portions thereof requiring heat for the bonding, said element being smaller in mass and made of a less conductive material than the workpiece to divert a desired amount of the current along a first path through and for concentrating current within the workpiece for developing substantial heat therewithin and said element also conducting current along a second path in the element to develop heat in the element and transfer the heat to the workpiece, the heat from both paths being sufficient to thermally bond at least a desired portion of the workpiece to the body.

6. A method as in claim 5, wherein the first and second electrodes are of sufficient mass and shape of suitable material that resistance to the bonding current flowing therethrough is insufficient to heat an electrode above room temperature such that, when current stops, each electrode functions as a heat sink to draw from the workpiece sufficient heat that the workpiece may be readily removed without breaking the bond to the body and wherein the conducting step further comprises:

locating the first and second electrodes sufficiently close together to substantially confine the workpiece therebetween in a position suitable for bonding to the body and to minimize conducting distance for current and heat between each electrode and the workpiece.

7. A method as in claim 6, wherein the workpiece is a stud having a base in the shape of a disc and a centrally located pedestal on the disc for mounting a heat sensitive device to the pedestal and wherein the step of conducting through the resistive element further comprises:

conducting the current through a flat strip about as wide as and supporting the base of the workpiece, said strip connecting the electrodes sufficiently close together that the base is confined for positioning the workpiece for bonding to the body, said strip being sufficiently thin and of a material suitable to divert current and heat into the base, said strip also having a thru hole therein under the centrally located pedestal portion of the base for diverting current and heat away from the pedestal and into a peripheral ring on the base whereon a heat sensitive bonding medium is located for bonding said ring portion of the workpiece to the body.

8. A method as in claim 7, wherein the connections to the power supply are flexible, further comprising the step of:

manipulating the electrodes and the conducting means with the workpiece confined therewith for aligning the workpiece to the body prior to bonding the same.

* * * * *